(12) United States Patent
Manivannan et al.

(10) Patent No.: US 10,839,279 B2
(45) Date of Patent: Nov. 17, 2020

(54) TRANSPONDER FABRICATION METHODS

(71) Applicant: Vorbeck Materials Corp., Jessup, MD (US)

(72) Inventors: Sriram Manivannan, Baltimore, MD (US); Dan F Scheffer, Frederick, MD (US); Kenneth E Fritsch, Arnold, MD (US); Jeremy D Smith, Annapolis, MD (US)

(*) Notice: Subject to any disclaimer, the term of this patent is extended or adjusted under 35 U.S.C. 154(b) by 0 days.

(21) Appl. No.: 15/557,380

(22) PCT Filed: May 6, 2016

(86) PCT No.: PCT/US2016/031151
§ 371 (c)(1),
(2) Date: Sep. 11, 2017

(87) PCT Pub. No.: WO2016/161466
PCT Pub. Date: Oct. 6, 2016

(65) Prior Publication Data
US 2018/0032851 A1    Feb. 1, 2018

(51) Int. Cl.
*G06K 19/077* (2006.01)
*H01Q 21/00* (2006.01)
(Continued)

(52) U.S. Cl.
CPC ..... *G06K 19/07718* (2013.01); *G06Q 10/087* (2013.01); *G06Q 50/28* (2013.01); *G06Q 50/30* (2013.01); *H01Q 21/0087* (2013.01); *H01Q 23/00* (2013.01); *H05K 3/361* (2013.01); *H05K 3/368* (2013.01); *H05K 3/4611* (2013.01); *H05K 3/4638* (2013.01)

(58) Field of Classification Search
CPC .......... H05K 3/36; H05K 3/361; H05K 3/368; H05K 3/4611; H05K 3/4638; G06K 19/07718; H01Q 21/0087; H01Q 23/00
See application file for complete search history.

(56) References Cited

U.S. PATENT DOCUMENTS 5,495,250 A * 2/1996 Ghaem ................ G06K 19/027
                                                            342/51
5,867,102 A * 2/1999 Souder ............. G06K 19/07718
                                                            283/83
(Continued)

FOREIGN PATENT DOCUMENTS

WO       2010133935 A1    11/2010

*Primary Examiner* — Peter Dungba Vo
*Assistant Examiner* — Jeffrey T Carley
(74) *Attorney, Agent, or Firm* — Trentice V. Bolar, Esq.

(57) ABSTRACT

Embodiments of the present invention relate to transponder fabrication. In an embodiment, a plurality of antenna elements is applied to a first substrate at a first pitch. A plurality of fully functioning first transponders is positioned on to the first substrate in a manner to each be in electrical communication with an antenna element included in the plurality of antenna elements and thereby forms a plurality of fully functioning second transponders. The plurality of fully functioning first transponders are positioned on a second substrate at a second pitch. The plurality of fully functioning first transponders have a first read range. Second transponders have an increased read range relative to second transponders. The second pitch is greater than the first pitch.

9 Claims, 4 Drawing Sheets

(51) Int. Cl.
   *H01Q 23/00*    (2006.01)
   *H05K 3/36*     (2006.01)
   *H05K 3/46*     (2006.01)
   *G06Q 50/28*    (2012.01)
   *G06Q 10/08*    (2012.01)
   *G06Q 50/30*    (2012.01)

(56) References Cited

U.S. PATENT DOCUMENTS

| | | | |
|---|---|---|---|
| 2006/0125641 A1* | 6/2006 | Forster | G06K 17/0025 340/572.8 |
| 2006/0238345 A1* | 10/2006 | Ferguson | G06K 7/0095 340/572.1 |
| 2006/0244603 A1* | 11/2006 | Kline | G06K 19/07718 340/572.7 |
| 2007/0057790 A1 | 3/2007 | Alden | |
| 2008/0060750 A1* | 3/2008 | Wang | G06K 19/077 156/238 |
| 2008/0289753 A1* | 11/2008 | Bauer | G06K 19/07718 156/269 |
| 2008/0295318 A1* | 12/2008 | Bohn | G06K 19/07718 29/601 |
| 2009/0038735 A1* | 2/2009 | Kian | G06K 19/07718 156/73.1 |
| 2009/0230198 A1* | 9/2009 | Armijo | B32B 38/0004 235/492 |
| 2010/0244656 A1* | 9/2010 | Ito | H01Q 1/2283 313/358 |
| 2011/0189452 A1 | 8/2011 | Lettow | |
| 2012/0007791 A1 | 1/2012 | Grbic | |
| 2012/0019363 A1* | 1/2012 | Fein | G06K 19/072 340/10.1 |
| 2014/0050903 A1* | 2/2014 | Lettow | H01B 1/24 428/201 |
| 2016/0066419 A1* | 3/2016 | Kamei | H05K 1/0393 174/254 |

* cited by examiner

TRANSPONDER FABRICATION METHODS

CROSS-REFERENCE TO RELATED APPLICATIONS

This application is a 371 of International Application No. PCT/US16/31151 filed May 6, 2016, which claims priority to U.S. Provisional Application No. 62/140,512 filed Mar. 31, 2015, which is hereby incorporated herein by reference.

BACKGROUND

The present invention relates generally to transponders and specifically to transponder fabrication methods. Transponders typically comprise an antenna inlay and an integrated circuit ("IC") in electrical communication therewith. The IC can comprise memory units for storing information. Transponders may operate in an active manner wherein the device is energized by an internal power source. Alternatively, transponders may operate in a passive manner wherein the device is energized by an external excitation signal. Transponders emit stored information that can be used for identification purposes.

Antenna inlays may comprise an etched, laser cut, or die cut metallic material. Subsequent to formation, inlays typically undergo an IC attachment process, which may comprise a hybrid batch-roll to roll process comprising affixing the IC to the inlay.

DETAILED DESCRIPTION

Figure 1:
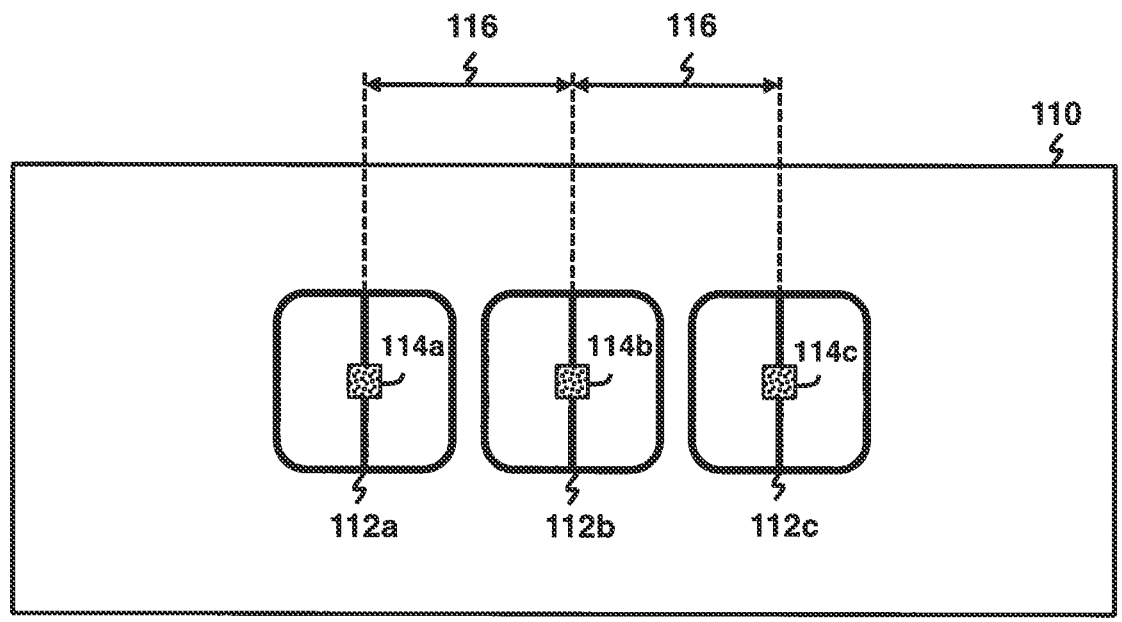
FIG. 1 depicts transponder inlay fabrication steps, in accordance with an embodiment of the present invention.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. As used herein, "graphene sheets" refer to individual single sheets of graphite that are up to 1 nm thick (i.e. one carbon atom thick).

As used herein, "graphite" refers to a plurality of individual graphene sheets held together by van der Waals forces. As used herein, "component pitch" is the distance between the centers of adjacent transponder components. As used herein, "IC pitch" is the distance between the centers of two adjacent ICs. As used herein, "production objects" are objects that are formed or assembled on a production or assembly line.

Transponders typically comprise an antenna inlay and an integrated circuit ("IC") in electrical communication therewith. ICs can comprise memory units for storing information. Transponders may operate in an active manner wherein the device is energized by an internal power source. Alternatively, transponders may operate in a passive manner wherein the device is energized by an external excitation signal. Transponders emit stored information that can be used for identification purposes.

Antenna inlays may comprise an etched, laser cut, or die cut metallic material. Subsequent to formation, inlays typically undergo an IC attachment process, which may comprise a hybrid batch-roll to roll process comprising affixing the IC to the inlay via a conductive adhesive and subsequent curing of the adhesive. Curing can be accomplished via heating or UV exposure in a curing station. The time required for IC attachment is often related to the IC pitch of ICs within the curing station (for batch curing) or on the substrate for non-batch curing. As IC pitch increases, the number of ICs that can be cured within a given time decreases. Hence, an increase in IC pitch results in a decrease in transponder processing efficiency (i.e. the number of transponders that can be fabricated at a given time).

Embodiments of the present invention seek to provide methods for fabricating multi-component transponders. Embodiments of the present invention seek to provide multiple antenna inlay components that can be combined in various combinations to produce a plurality of different transponders having varying reading ranges. Embodiments of the present invention seek to provide methods to minimize IC pitch to facilitate the subsequent processing of various transponder varieties, including but not limited to dipole and dual dipole. Embodiments of the present invention seek to provide transponder fabrication methods that increases the reading distance of preformed fully functional transponder. Other embodiments of the present invention seek to increase the roll-to-roll batch processing efficiency of dipole and dual-dipole transponders.

In certain embodiments, transponders comprise a first transponder component. First transponder components can comprise a conductive planar closed circuit structure having a plurality of IC contact pads. First transponder components can be antenna components. First transponder components can comprise a metal-based conductive composition, which can comprise aluminum, copper, silver, gold, annealed copper, calcium, tungsten, zinc, and/or iron. In other embodiments, transponders can further comprise second transponder components that are in electrical communication with first transponder components. Second transponder components can comprise a plurality of conductive elements. For example, second transponder elements can be dipole and/or dual dipole antenna elements. Second transponder components can comprise a graphene sheet-based conductive composition ("the composition").

The composition can further comprise graphite oxide, graphene tubes, graphene rods, graphite, and/or other carbonaceous material. However, such carbonaceous materials may not be used as a substitute for graphene sheets. The composition can be derived as disclosed in U.S. Pat. No. 7,658,901 B2 by Prud'Homme et al, United States patent application 2011/0189452 A1 by Lettow et al., McAllister et al. (*Chem. Mater.* 2007, 19, 4396-4404), United States patent application 2014/0050903 A1 by Lettow et al., and U.S. Pat. No. 8,278,757 B2 by Crain et al, which are hereby incorporated by reference in their entirety ("the references"). Applicable transponder components include, but are not limited to, loop antennas, dipole antennas, Yagi-Uda antennas, random wire antennas, horn antennas, dual-dipole, and patch antennas.

First and/or second transponder components can be any shape that can facilitate the transmission and/or reception of RF signals at the desired frequency, including but not limited to, round, ovular, elliptical, crescent, trapezoidal, polygonal, and rectangular. Transponder components can be linear polarized or circular polarized. First and/or second transponder components can be formed on substrates via screen printing, painting, pouring, spin casting, solution casting, dip coating, powder coating, by syringe or pipette, spray coating, curtain coating, lamination, co-extrusion, electrospray deposition, ink-jet printing, spin coating, thermal transfer (including laser transfer) methods, doctor blade printing, screen printing, rotary screen printing, gravure printing, lithographic printing, intaglio printing, digital printing, capillary printing, offset printing, electrohydrodynamic (EHD) printing (as described in WO 2007/053621, which is herein incorporated by reference), microprinting, pad printing, tampon printing, stencil printing, wire rod coating, drawing, flexographic printing, stamping, xerography, microcontact printing, dip pen nanolithography, laser printing, via pen or similar means, in accordance with an embodiment of the present invention.

Applicable substrates can include, but are not limited to, substrates that are capable of withstanding temperatures of 100° C. to 180° C. Applicable substrates can include, but are not limited to, flexible and/or stretchable materials, silicones and other elastomers as well as polymeric materials, metals (such as aluminum, copper, steel, stainless steel, etc.), adhesives, heat-sealable materials (such as cellulose, biaxially oriented polypropylene (BOPP), poly(lactic acid), polyurethanes, nylon, etc.), fabrics (including cloths) and textiles (such as cotton, wool, polyesters, rayon, etc.), clothing, plastics (including PET, etched PET, PVC, polyethylene, polypropylene, etc.), ceramics, silicon surfaces, wood, paper, cardboard, paperboard, cellulose-based materials, glassine, labels, silicon, laminates, corrugated materials, concrete, and brick. The substrates can be in the form of films, papers, and larger three-dimensional objects.

The substrates may treated with coatings that provide aesthetics, impact resistance, and/or thermal resistance. Applicable coatings can comprise, but are not limited to, indium tin oxide, and antimony tin oxide. Applicable substrates may be woven, nonwoven, and in mesh form.

The paper-based materials can be surface treated. Examples of applicable surface treatments include, but are not limited to, coatings, such as polymeric coatings, which can include PET, polyethylene, polypropylene, acetates, and nitrocellulose. Coatings may be adhesives. The paper based materials may be sized.

Examples of applicable polymeric materials include, but are not limited to, those comprising thermoplastics and thermosets, including elastomers and rubbers (including thermoplastics and thermosets), silicones, fluorinated polysiloxanes, natural rubber, butyl rubber, chlorosulfonated polyethylene, chlorinated polyethylene, styrene/butadiene copolymers (SBR), styrene/ethylene/butadiene/stryene copolymers (SEBS), styrene/ethylene/butadiene/stryene copolymers grafted with maleic anhydride, styrene/isoprene/styrene copolymers (SIS), polyisoprene, nitrile rubbers, hydrogenated nitrile rubbers, neoprene, ethylene/propylene copolymers (EPR), ethylene/propylene/diene copolymers (EPDM), ethylene/vinyl acetate copolymer (EVA), hexafluoropropylene/vinylidene fluoride/tetrafluoroethylene copolymers, tetrafluoroethylene/propylene copolymers, fluorelastomers, polyesters (such as poly(ethylene terephthalate), poly(butylene terephthalate), poly(ethylene naphthalate), liquid crystalline polyesters, poly(lactic acid)).; polystyrene; polyamides (including polyterephthalamides); polyimides (such as Kapton®); aramids (such as Kevlar® and Nomex®); fluoropolymers (such as fluorinated ethylene propylene (FEP), polytetrafluoroethylene (PTFE), poly(vinyl fluoride), poly(vinylidene fluoride)); polyetherimides; poly(vinyl chloride); poly(vinylidene chloride); polyurethanes (such as thermoplastic polyurethanes (TPU); spandex, cellulosic polymers (such as nitrocellulose, cellulose acetate, etc.); styrene/acrylonitriles polymers (SAN); arcrylonitrile/butadiene/styrene polymers (ABS); polycarbonates; polyacrylates; poly(methyl methacrylate); ethylene/vinyl acetate copolymers; thermoset epoxies and polyurethanes; polyolefins (such as polyethylene (including low density polyethylene, high density polyethylene, ultrahigh molecular weight polyethylene, etc.), polypropylene (such as biaxially-oriented polypropylene, etc.); and Mylar.

The polymeric materials may be non-woven materials, such as Tyvek®. The polymeric materials may be adhesive or adhesive-backed materials, such as adhesive-backed papers or paper substitutes. The polymeric materials may be mineral-based paper substitutes, such as Teslin®. The substrate may be a transparent or translucent or optical material, such as glass, quartz, polymer (such as polycarbonate or poly(meth)acrylates (such as poly(methyl methacrylate).

The transponders can be fabricated to operate across a variety of radio frequency bands including, but not limited to, HF, VHF, UHF, L, S, C, X, Ku, K, Ka, V, W, mm, A, B, C, D E, F, G H, I, J, K, L, and M frequencies. The transponders can be fabricated to function in an active or/or passive manner. The transponders can include one or more memory modules.

FIG. 1 depicts fabrication steps, in accordance with an embodiment of the present invention. First transponder components 112a,b,c are conductive planar closed circuit structures having a plurality of IC contact pads. First transponder components 112a,b,c are formed in a manner to receive and/or transmit RF signals. First transponder 112a, 112b, and/or 112c can be formed on substrate 110 using an aforementioned method. Although depicted as comprising three copies of first transponder component 112, any number of may be formed on substrate 110. In certain embodiments, substrate 110 is a section of a roll. ICs 114a,b,c can be affixed to substrate 110 in a manner to be in electrical communication with first transponder components 112a,b,c, respectively.

IC pitch 116 reflects the distance between adjacent pairs of IC 114 copies as measured from the midpoints thereof. IC attachment processing efficiency is typically associated with pitch. ICs are typically affixed to conductive elements using a conductive adhesive and subsequent curing of in, for example, a thermode station. IC attachment speeds, and therefore processing efficiency, typically increase as pitch decreases, wherein the decreasing pitch brings ICs closer together. For example, for thermode stations allowing batch processing, decreased pitch can increase the number of IC units that can be cured at once.

For thermode stations allowing singular curing applications, decreased pitch decreases the degree to which rollers have to turn to move to the next IC, which decreases overall processing time. For thermode stations employing a moving thermode head, the distance with which the head traverses to the next IC decreases as IC pitch decreases. Transponder fabrication speeds typically increase as IC attachment speed increases. Transponder fabrication methods disclosed herein utilize modular fabrication approaches that take advantage of the influence that IC pitch has on overall transponder fabrication speeds by forming inlays in at least two separate steps (explained further below). The first fabrication step seeks to reduce IC pitch (i.e. maximize IC quantity for) as much as possible regardless of whether the transponder will eventually employ, for example, a dipole or dual dipole inlay.

Figure 2:
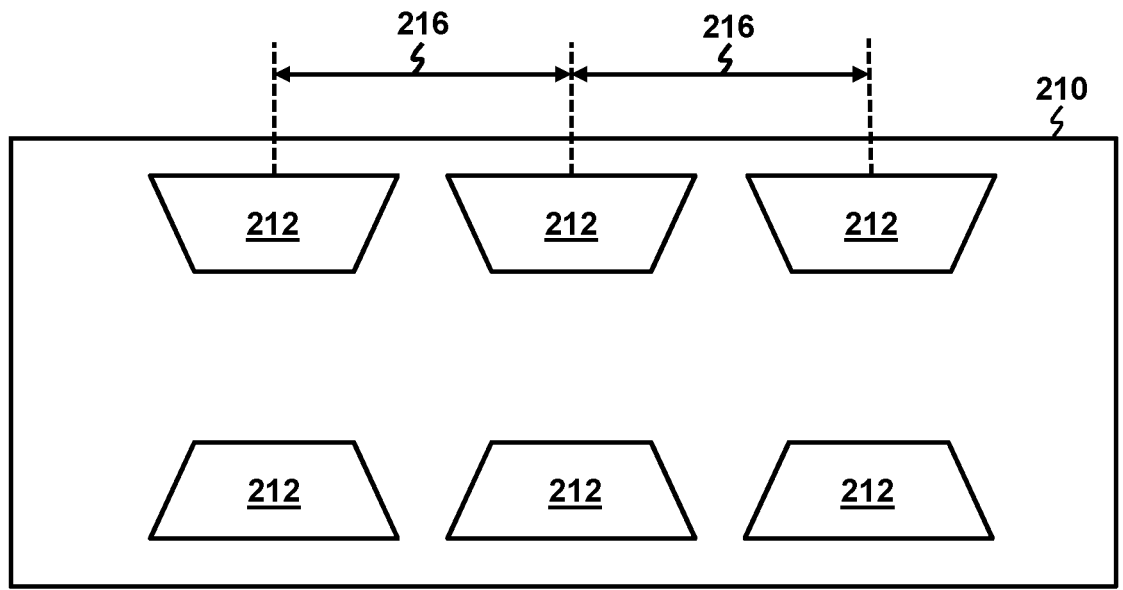
FIG. 2 depicts additional transponder inlay fabrication steps, in accordance with an embodiment of the present invention.
Figure 3:
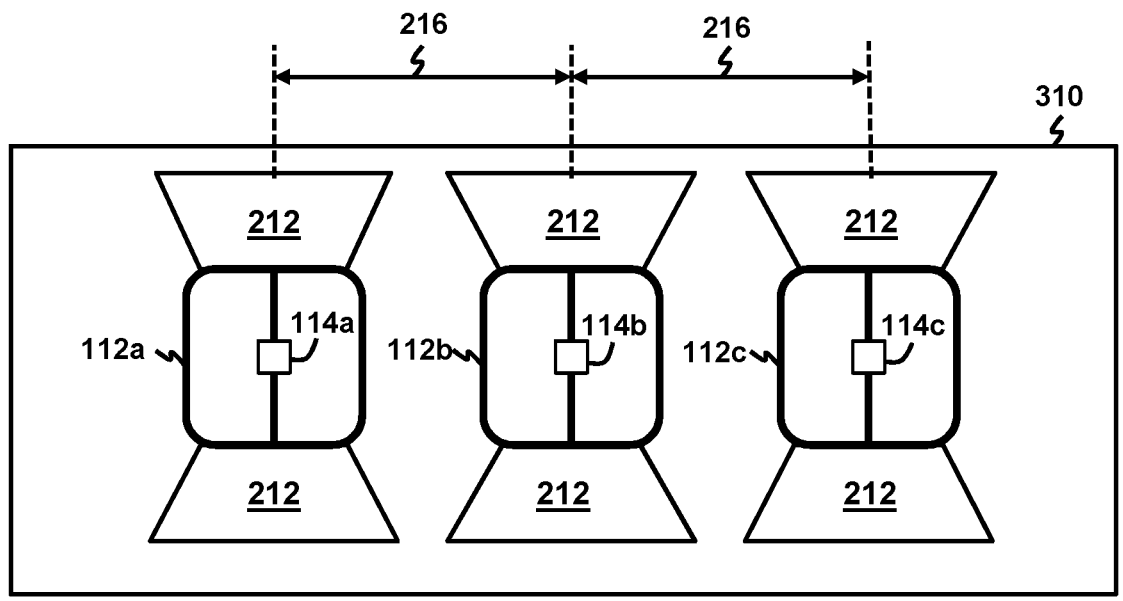
FIG. 3 depicts additional transponder inlay fabrication steps, in accordance with an embodiment of the present invention.

Although the first transponder components illustrated in FIG. 1 are fully functional and may be used as is, their structure may subsequently be modified in a manner to increase their read range and/or modify their operational frequencies. FIGS. 2-3 illustrate such modifications, in accordance with an embodiment of the present invention. FIG. 2 depicts additional fabrication steps, in accordance with an embodiment of the present invention. Second transponder components 212a,b,c are identical conductive components that are oppositely positioned axially. Second transponder components 212a,b,c can be formed in a manner to be subsequently affixed to first transponder components 121a,b,c, respectively, to expand the read range thereof.

Second transponder components 212a,b,c can be formed on substrate 210 using an aforementioned application method. Second transponder components 212a,b,c are formed on substrate 210 at a distance of component pitch 216. In certain embodiments, substrate 210 is a three-dimensional production object that requires tracking and comprises one copy of transponder 212. Here, second transponder components 212 can be formed on substrate 210 during the production of substrate 210. FIG. 3 depicts additional fabrication steps, in accordance with an embodiment of the present invention. The transponders of substrates 110 are separated and applied to substrate 210 using an appropriate method to form substrate 310, which brings first transponder components 112 and second transponder components 212 in to electrical communication with each other. Where substrate 210 is a production substrate, substrates 210 and 310 are the same. Transponders depicted in FIG. 3 have an expanded the read range relative to transponders depicted in FIG. 1. For example, fabricating the transponders of FIG. 3 on a single substrate at component pitch 216 (i.e. a fabrication method that uses the same pitch) requires greater processing time compared to the modular fabrication method presently disclosed (i.e. a fabrication method that uses different pitches).

Figure 4:
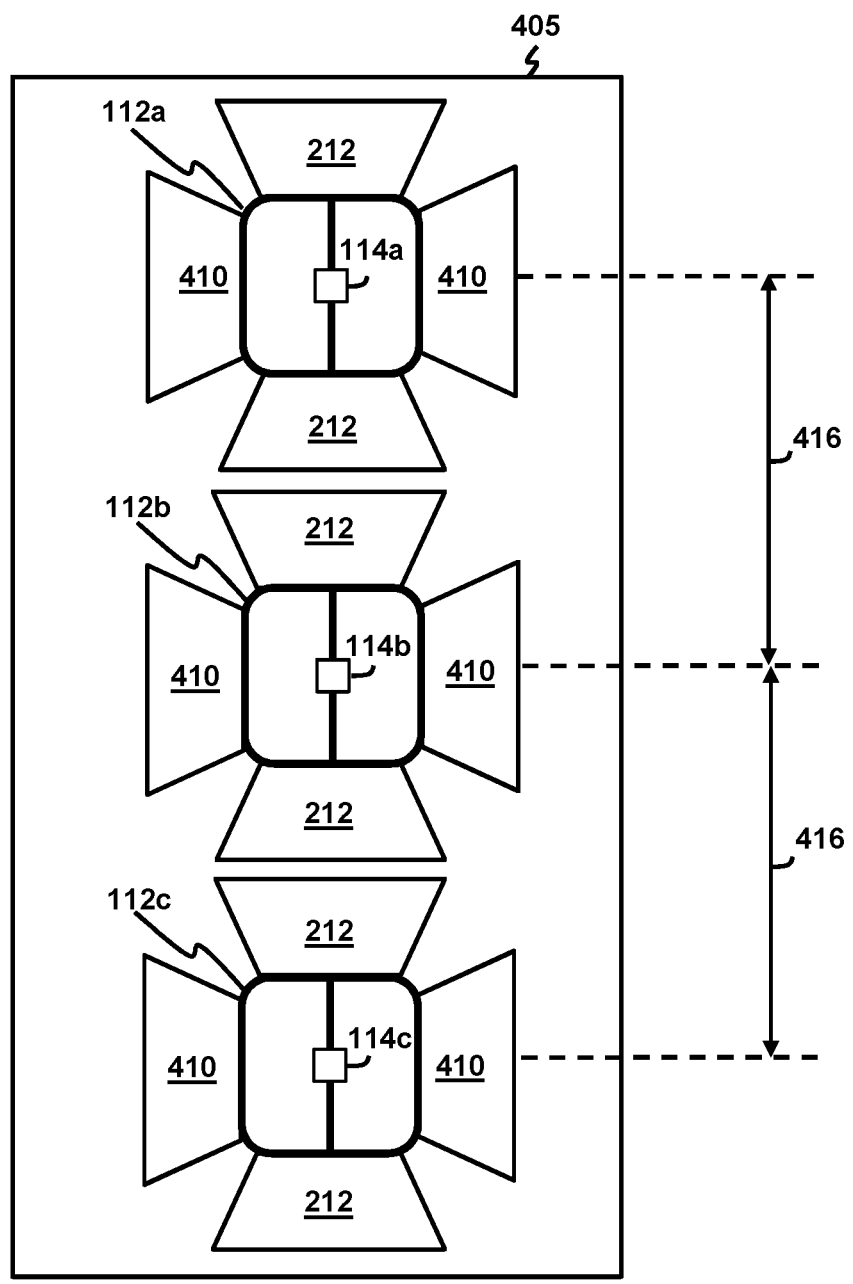
FIG. 4 depicts additional transponder inlay fabrication steps, in accordance with an embodiment of the present invention.

FIG. 4 depicts additional fabrication steps, in accordance with an embodiment of the present invention. Second transponder components 410 consist of two pairs of identical conductive components that are oppositely positioned axially relative to each other, wherein the pairs are further positioned at an angle relative to each other. The angle may be up to 90 degrees or less. Second transponder components 410 are formed on substrate 410 at a distance of component pitch 416. In certain embodiments, substrate 405 is a production object and only comprises one copy of second transponder components 410. The transponders of FIG. 1 are individualized and each are subsequently affixed to substrate 405 thereby forming the transponders of FIG. 4. The modular fabrication method disclosed herein (i.e. a fabrication method that uses different pitches) takes advantage of pitch 116 and allows faster processing of the transponders of FIG. 4 compared to attempts to fabricate said transponders using a single substrate at component pitch 416 (i.e. a fabrication method that uses the same pitch).

As various modifications could be made in the constructions and methods herein described and illustrated without departing from the scope of the invention, it is intended that all matter contained in the foregoing description or shown in the accompanying drawings shall be interpreted as illustrative rather than limiting. Thus the breadth and scope of the present invention should not be limited by any of the above-described exemplary embodiments, but should be defined only in accordance with the following claims appended hereto and their equivalents.

What is claimed is:

1. A transponder fabrication method, the method comprising:
    forming a plurality of first transponder components on a first substrate at an integrated circuit (hereinafter "IC") pitch, each first transponder component comprising:
        a metal-based conductive composition; and
        a plurality of IC contact pads;
    curing the plurality of first transponder components;
    affixing an IC to each of the plurality of first transponder components thereby forming a plurality of first transponders each comprising a first read range;
    separating the plurality of first transponders from each other thereby forming individual first transponders;
    forming a plurality of second transponder components on a second substrate at a component pitch using a graphene sheet-based conductive composition;
    curing the plurality of second transponder components;
    affixing each first transponder to a second transponder component on the second substrate at the component pitch, thereby forming a second transponder comprising a second read range; and
    wherein the second read range is greater than the first read range.

2. The transponder fabrication method of claim 1, wherein
    the forming the plurality of first transponder components comprises the use of a metal-based conductive composition; and
    the metal-based conductive composition comprises one or more of aluminum, copper, and silver.

3. The transponder fabrication method of claim 2, wherein
    each of the plurality of second transponder components comprise an antenna element;
    the antenna element is a dipole or a dual dipole; and
    the antenna element comprises a thickness of up to 3 µm.

4. The transponder fabrication method of claim 3, further comprising forming the graphene-sheet based conductive composition using individual graphene sheets.

5. The transponder fabrication method of claim 4, wherein forming the plurality of first transponders components comprises forming a conductive planar closed circuit structure comprising the plurality of IC contact pads.

6. The transponder fabrication method of claim 5, wherein forming the plurality of first transponder components on the first substrate comprises a printing technique.

7. The transponder fabrication method of claim 6, wherein the step of forming the plurality of second transponder components comprises a printing technique.

8. The transponder fabrication method of claim 7, wherein the second substrate comprises a three-dimensional production object.

9. The transponder fabrication method of claim 7, wherein the second substrate comprises a film or a paper.

* * * * *